United States Patent
Li et al.

(10) Patent No.: US 9,438,188 B2
(45) Date of Patent: Sep. 6, 2016

(54) COMMON-GATE AMPLIFIER FOR HIGH-SPEED DC-COUPLING COMMUNICATIONS

(71) Applicant: QUALCOMM Incorporated, San Diego, CA (US)

(72) Inventors: Miao Li, San Diego, CA (US); Li Sun, San Diego, CA (US); Zhi Zhu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/486,885

(22) Filed: Sep. 15, 2014

(65) Prior Publication Data

US 2016/0079942 A1 Mar. 17, 2016

(51) Int. Cl.
*H04L 25/06* (2006.01)
*H03F 3/45* (2006.01)
(Continued)

(52) U.S. Cl.
CPC .......... *H03F 3/45071* (2013.01); *H03F 3/183* (2013.01); *H03F 3/45179* (2013.01); *H03F 3/45677* (2013.01); *H03F 3/45713* (2013.01); *H04B 1/16* (2013.01); *H04L 25/0272* (2013.01); *H03F 2200/129* (2013.01); *H03F 2200/255* (2013.01); *H03F 2200/36* (2013.01); *H03F 2200/453* (2013.01); *H03F 2203/45008* (2013.01); *H03F 2203/45078* (2013.01);
(Continued)

(58) Field of Classification Search
USPC ........................................................ 375/318
See application file for complete search history.

(56) References Cited

U.S. PATENT DOCUMENTS 5,821,768 A * 10/1998 Rau ...................... H04L 25/0292
326/30
6,011,952 A * 1/2000 Dankberg .............. H04B 1/126
455/24

(Continued)

FOREIGN PATENT DOCUMENTS

EP 2028761 A1 2/2009

OTHER PUBLICATIONS

Kaviani, K. et al., "A 0.4-mW/Gb/s Near-Ground Receiver Front-End With Replica Transconductance Termination Calibration for a 16-Gb/s Source-Series Terminated Transceiver," Solid-State Circuits, IEEE Journal of , vol. 48, No. 3, pp. 636,648, Mar. 2013.*

(Continued)

*Primary Examiner* — Daniel Washburn
*Assistant Examiner* — Berhanu Tadese
(74) *Attorney, Agent, or Firm* — Loza & Loza LLP

(57) ABSTRACT

In one embodiment, a receiver comprises a differential common-gate amplifier having a differential input and a differential output, wherein the differential input comprises a first input and a second input, and the differential common-gate amplifier is configured to amplify an input differential signal at the differential input into an amplified differential signal at the differential output. The receiver also comprises a common-mode voltage sensor configured to sense a common-mode voltage of the input differential signal, a replica circuit configured to generate a replica voltage that tracks a direct current (DC) voltage at at least one of the first and second inputs, and a comparator configured to compare the sensed common-mode voltage with the replica voltage, and to adjust a first bias voltage input to the differential common-gate amplifier based on the comparison, wherein the DC voltage depends on the first bias voltage.

18 Claims, 10 Drawing Sheets

(51) Int. Cl.
*H03F 3/183* (2006.01)
*H04B 1/16* (2006.01)
*H04L 25/02* (2006.01)

(52) U.S. Cl.
CPC ........ *H03F2203/45112* (2013.01); *H03F 2203/45302* (2013.01); *H03F 2203/45306* (2013.01); *H03F 2203/45418* (2013.01); *H03F 2203/45422* (2013.01); *H03F 2203/45424* (2013.01)

(56) References Cited

U.S. PATENT DOCUMENTS

| | | | | |
|---|---|---|---|---|
| 6,028,479 | A * | 2/2000 | Babanezhad | H03F 3/3061 330/253 |
| 6,882,224 | B1 * | 4/2005 | Gaboury | H03F 1/301 330/253 |
| 7,508,266 | B1 * | 3/2009 | Hissen | H03F 1/0211 330/149 |
| 8,350,622 | B2 * | 1/2013 | Kumar | H03F 1/0266 330/253 |
| 2001/0004219 | A1 | 6/2001 | Bangs et al. | |
| 2004/0150476 | A1 * | 8/2004 | Michalski | H03F 3/005 330/258 |
| 2006/0214731 | A1 | 9/2006 | Kelly et al. | |
| 2007/0109051 | A1 * | 5/2007 | Sutardja | 330/258 |
| 2010/0066450 | A1 * | 3/2010 | Palmer | H03F 3/45179 330/261 |
| 2010/0148873 | A1 * | 6/2010 | Li | H03F 1/223 330/277 |
| 2010/0237942 | A1 * | 9/2010 | Li | H03F 1/26 330/253 |
| 2012/0139638 | A1 * | 6/2012 | Kaviani | H03F 3/45183 330/289 |
| 2012/0154056 | A1 * | 6/2012 | Kuo | H03F 1/3205 330/301 |
| 2012/0306574 | A1 * | 12/2012 | Ginsburg | H03F 3/45179 330/260 |
| 2014/0145760 | A1 * | 5/2014 | Nguyen | H04L 25/0282 326/82 |
| 2015/0077183 | A1 * | 3/2015 | Ciubotaru | H03F 3/45179 330/254 |

OTHER PUBLICATIONS

Kaviani K., et al., "A 0.4-mW/Gb/s Near-Ground Receiver Front-End With Replica Transconductance Termination Calibration for a 16-Gb/s Source-Series Terminated Transceiver," IEEE Journal of Solid-State Circuits, Mar. 2013, vol. 48, No. 3, pp. 636-648.
International Search Report and Written Opinion—PCT/US2015/041506—ISA/EPO—Sep. 30, 2015.

* cited by examiner

COMMON-GATE AMPLIFIER FOR HIGH-SPEED DC-COUPLING COMMUNICATIONS

BACKGROUND

1. Field

Aspects of the present disclosure relate generally to amplifiers, and more particularly, to common-gate amplifiers.

2. Background

A device may include a front-end analog receiver for receiving an incoming signal from another device. The front-end receiver may perform front-end processing on the received signal (e.g., amplification, equalization, etc.) before forwarding the signal to other components in the device for further processing. A current mode logic (CML) amplifier is typically employed in the front-end receiver to amplify the received signal.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to an aspect, a receiver is described herein. The receiver comprises a differential common-gate amplifier having a differential input and a differential output, wherein the differential input comprises a first input and a second input, and the differential common-gate amplifier is configured to amplify an input differential signal at the differential input into an amplified differential signal at the differential output. The receiver also comprises a common-mode voltage sensor configured to sense a common-mode voltage of the input differential signal, and a replica circuit configured to generate a replica voltage that tracks a direct current (DC) voltage at at least one of the first and second inputs. The receiver further comprises a comparator configured to compare the sensed common-mode voltage with the replica voltage, and to adjust a first bias voltage input to the differential common-gate amplifier based on the comparison, wherein the DC voltage depends on the first bias voltage.

A second aspect relates to a method for operating a differential common-gate amplifier having a differential input and a differential output, wherein the differential input comprises a first input and a second input. The method comprises sensing a common-mode voltage of a differential signal input to the differential input of the differential common-gate amplifier, generating a replica voltage that tracks a direct current (DC) voltage at at least one of the first and second inputs, comparing the sensed common-mode voltage with the replica voltage, and adjusting a first bias voltage input to the differential common-gate amplifier based on the comparison, wherein the DC voltage depends on the first bias voltage.

A third aspect relates to an apparatus for operating a differential common-gate amplifier having a differential input and a differential output, wherein the differential input comprises a first input and a second input. The apparatus comprises means for sensing a common-mode voltage of a differential signal input to the differential input of the differential common-gate amplifier, means for generating a replica voltage that tracks a direct current (DC) voltage at at least one of the first and second inputs, means for comparing the sensed common-mode voltage with the replica voltage, and means for adjusting a first bias voltage input to the differential common-gate amplifier based on the comparison, wherein the DC voltage depends on the first bias voltage.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
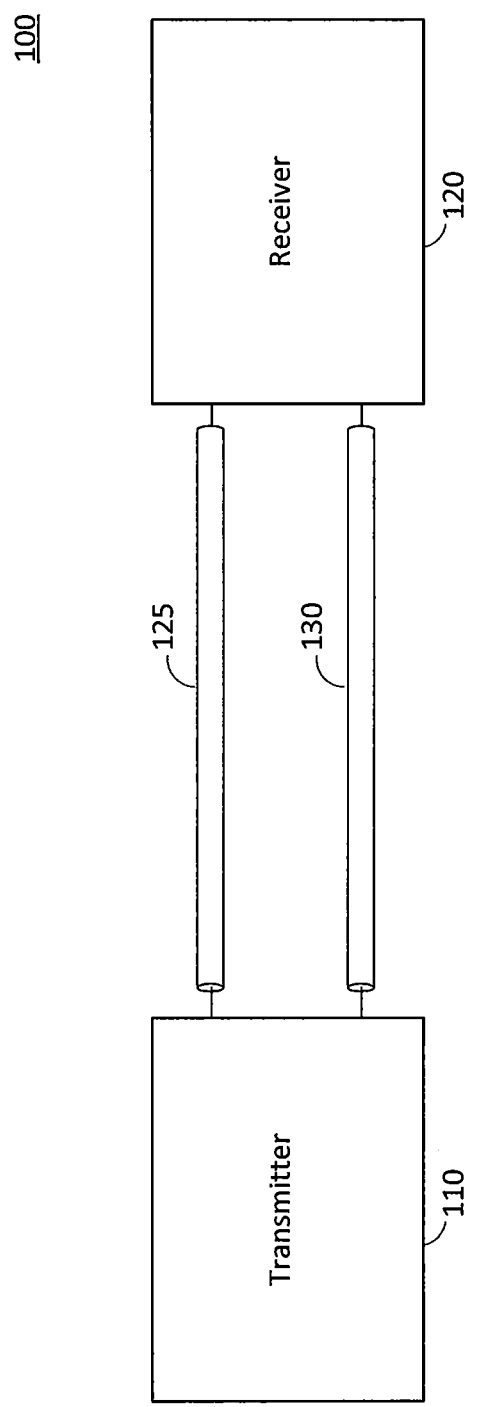
FIG. 1 shows an example of a communication system including a transmitter and a receiver.

FIG. 1 shows an example of a communication system 100 comprising a transmitter 110 and a receiver 120. The transmitter 110 may be located on a first device and the receiver 120 may be located on a second device, in which the transmitter 110 and the receiver 120 are used to transfer data from the first device to the second device over first and second transmission lines 125 and 130. The first and second transmission lines 125 and 130 may comprise traces on a printed circuit board and/or chip, conductors in a coaxial cable or another type of cable, a twisted wire pair, etc. The transmitter 110 may transmit a differential signal to the receiver 120 over the first and second transmission lines 125 and 130. The receiver 120 may perform front-end processing (e.g., amplification, equalization, etc.) on the received signal before forwarding the signal to other components in the second device for further processing.

The transmitter 110 and the receiver 120 may be used for short-haul communication between the first and second devices. For example, the first and second devices may be located on separate chips, in which the transmitter 110 and the receiver 120 are used for inter-chip communication between the devices. For high-speed communication, the transmitter 110 may transmit data (e.g., serial data) to the receiver 120 over the transmission lines 125 and 130 at speeds in the gigahertz range. This allows the devices to communicate at higher data rates using fewer pins and transmission lines.

Figure 2:
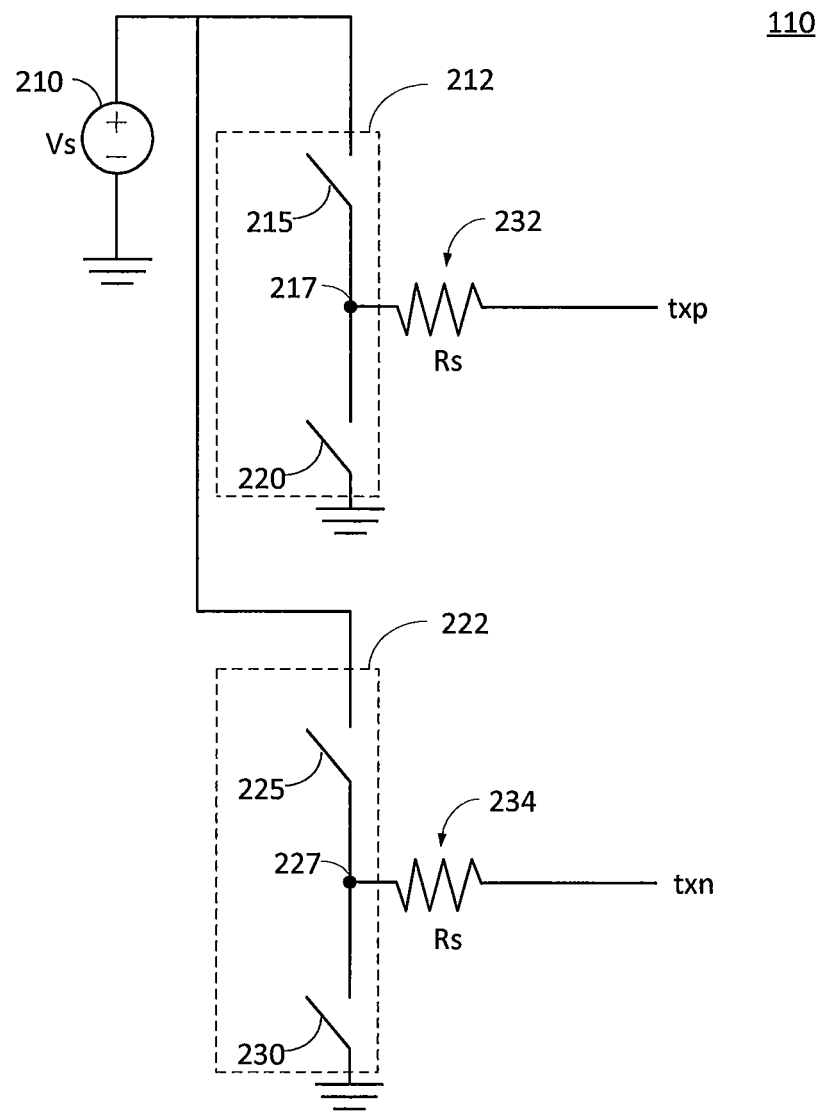
FIG. 2 shows a transmitter according to an embodiment of the present disclosure.

FIG. 2 shows an exemplary implementation of the transmitter 110. In this example, the transmitter 110 comprises a first output driver 212 and a second output driver 222. The first output driver 212 is coupled to the first transmission line 125 (not shown) via a first resistor 232, and the second output driver 222 is coupled to the second transmission line 130 (not shown) via a second resistor 234. The first and second resistors 232 and 234 may each have a resistance (denoted "Rs") of approximately 50Ω or another resistance.

The first output driver 212 comprises a first switch 215 and a second switch 220, in which the first switch 215 is coupled between a voltage source 210 and node 217, the second switch 220 is coupled between node 217 and ground, and the first resistor 232 is coupled between node 217 and the first transmission line 125. In one example, each of the first and second switches 215 and 220 comprises an n-type metal-oxide semiconductor (NMOS) transistor. In another example, the first switch 215 comprises a p-type metal-oxide semiconductor (PMOS) transistor and the second switch 220 comprises an NMOS transistor. The voltage source 210 may provide a DC voltage Vs (e.g., 160 mV, 200 mV, 400 mV, 480 mV, etc.).

In operation, the first output driver 212 drives node 217 high or low. To drive node 217 high, the first switch 215 is turned on and the second switch 220 is turned off. This causes the first switch 215 to couple node 217 to the source voltage Vs. To drive node 217 low, the second switch 220 is turned on and the first switch 215 is turned off. This causes the second switch 220 to couple node 217 to ground.

The second output driver 222 comprises a third switch 225 and a fourth switch 230, in which the third switch 225 is coupled between the voltage source 210 and node 227, the fourth switch 230 is coupled between node 227 and ground, and the second resistor 234 is coupled between node 227 and the second transmission line 130. In one example, each of the third and fourth switches 225 and 230 comprises an NMOS transistor. In another example, the third switch 225 comprises a PMOS transistor and the fourth switch 230 comprises an NMOS transistor.

In operation, the second output driver 222 drives node 227 high or low. To drive node 227 high, the third switch 225 is turned on and the fourth switch 230 is turned off. This causes the third switch 225 to couple node 227 to the source voltage Vs. To drive node 227 low, the fourth switch 230 is turned on and the third switch 225 is turned off. This causes the fourth switch 230 to couple node 227 to ground.

To transmit data to the receiver 120 over the transmission lines 125 and 130, the first and second output drivers 212 and 222 are driven in a complementary fashion. For example, to transmit a bit value of one, the first output driver 212 may be driven high and the second output driver 222 may be driven low. To transmit a bit value of zero, the first output driver 212 may be driven low and the second output driver 222 may be driven high. For high-speed communication, the switches 215, 220, 225 and 230 may be switched at speeds in the gigahertz range.

The receiver 120 may employ a current mode logic (CML) differential amplifier to amplify the signal from the transmitter 110. However, the CML amplifier may require charged device model (CDM) electrostatic discharge (ESD) protection, which reduces bandwidth. This is because the received signal is input to the gates of transistors (e.g., PMOS transistors and/or NMOS transistors) in the CML amplifier, in which the gates require by-pass diodes to protect the gate oxides of the transistors from ESD current (e.g., by shunting the current around the gate oxides). The by-pass diodes have parasitic capacitances, which reduce the bandwidth of the CLM amplifier.

Embodiments of the present disclosure provide front-end receivers that employ a differential common-gate amplifier as an alternative to a CML differential amplifier. The common-gate amplifier advantageously alleviates the requirement of CDM ESD protection. This is because the received differential signal is input to the drains/sources of transistors in the common-gate amplifier instead of the gates of the transistors. The drains/sources of the transistors typically do not require by-pass diodes for CDM ESD protection, and therefore avoid the bandwidth reduction caused by the by-pass diodes discussed above. Another advantage of the common-gate amplifier is that the input differential signal is level-shifted up at the differential output of the common-gate amplifier for next stage processing, as discussed further below.

Figure 3A:
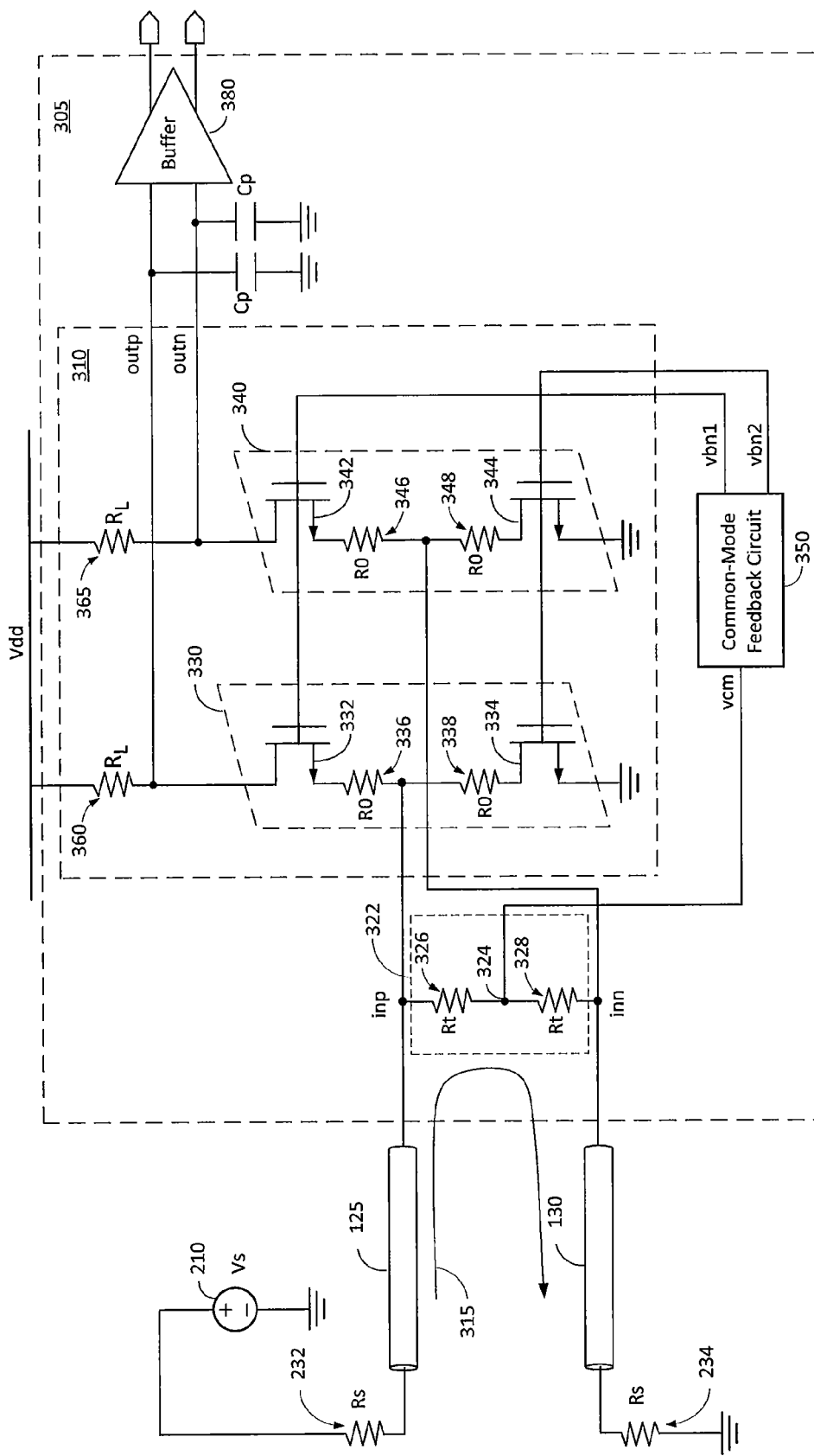
FIGS. 3A and 3B show a front-end receiver including a differential common-gate amplifier according to an embodiment of the present disclosure.

FIG. 3A shows a front-end receiver 305 comprising a differential common-gate amplifier 310 according to an embodiment of the present disclosure. The differential common-gate amplifier 310 has a differential input comprising a first input (denoted "inp") coupled to the first transmission line 125, and a second input (denoted "inn") coupled to the second transmission line 130. The receiver 305 comprises first and second termination resistors 326 and 328 coupled in series between the first and second inputs (inp,inn). The first and second termination resistors 326 and 328 may each have a resistance (denoted "Rt") of approximately 50Ω or another resistance. In one aspect, the resistance Rt may approximately match a characteristic impedance (e.g., 50Ω) of the transmission lines 125 and 130.

FIG. 3A shows an example in which the transmitter 110 transmits a bit value of one to the receiver 305. In this example, the first transmission line 125 is coupled to the voltage source 210 at the transmitter side via resistor 232, and the second transmission line 130 is coupled to ground at the transmitter side via resistor 234. This may be done, for example, by turning on the first and fourth switches 215 and 230 shown in FIG. 2. In this example, current flows through the transmission lines 125 and 130 and the termination resistors 326 and 328 in the direction indicated by the arrow 315 in FIG. 3A. As a result, a positive differential voltage forms across the first and second inputs (inp,inn) of the differential common-gate amplifier 310.

Figure 3B:
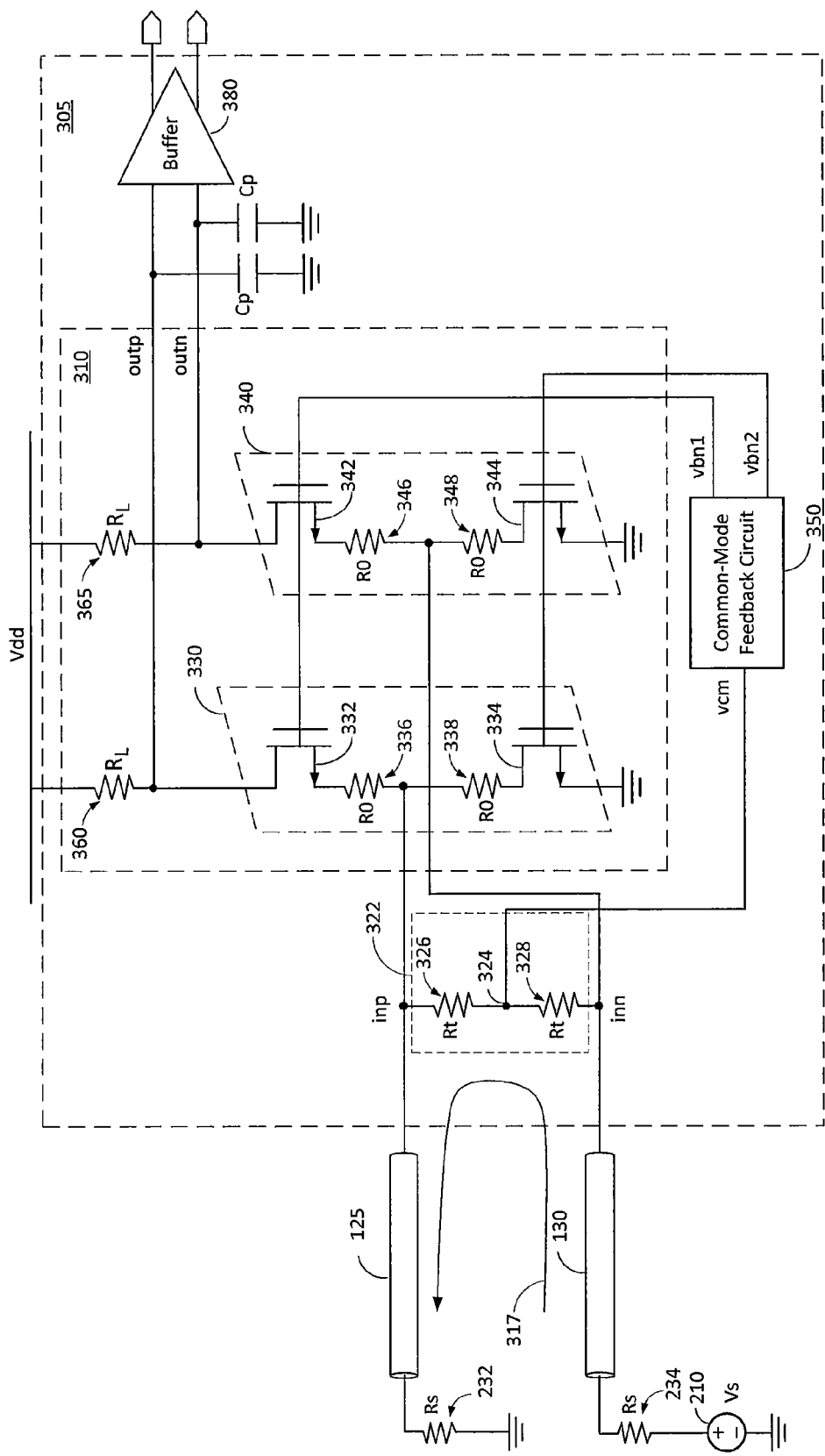

FIG. 3B shows an example in which the transmitter 110 transmits a bit value of zero to the receiver 305. In this example, the first transmission line 125 is coupled to ground at the transmitter side via resistor 232 and the second transmission line 130 is coupled to the voltage source 210 at the transmitter side via resistor 234. This may be done, for example, by turning on the second and third switches 220 and 225 shown in FIG. 2. In this example, current flows through the transmission lines 125 and 130 and the termination resistors 326 and 328 in the direction indicated by the arrow 317 in FIG. 3B (i.e., reverse of the direction shown in FIG. 3A). As a result, a negative differential voltage forms across the first and second inputs (inp,inn) of the differential common-gate amplifier 310.

Thus, the transmitter 110 transmits different bit values by reversing the polarity of the differential voltage at the differential input (inp,inn) of the amplifier 310. The common-mode voltage (denoted "vcm") of the differential voltage may be approximately equal to half the source voltage Vs (assuming the resistances Rs and Rt are approximately equal). For example, if the source voltage Vs equals 400 mV, then the input common-mode voltage may be approximately equal to 200 mV. The voltage at the node 324 between the termination resistors 326 and 328 may be approximately equal to the common-mode voltage of the input differential signal, and therefore may be used to sense the input common-mode voltage, as discussed further below.

Referring back to FIG. 3A, the differential common-gate amplifier 310 has a differential output comprising a first output (denoted "outp") and a second output (denoted "outn"). The differential common-gate amplifier 310 is configured to amplify the differential signal at the differential input (inp,inn) of the amplifier 310 into an amplified differential signal at the differential output (outp,outn) of the amplifier 310. In the example shown in FIG. 3A, the differential output (outp,outn) of the amplifier 310 is coupled to a buffer 380, which may comprise an equalizer, a second-stage amplifier (e.g., CML amplifier), or a combination thereof. FIG. 3A shows patristic parasitic capacitances (modeled as parasitic capacitors Cp) between the differential output (outp,outn) of the amplifier and the differential input of the buffer 380.

The differential common-gate amplifier 310 comprises a first amplifier 330 coupled between the first input (inp) and first output (outp) of the differential common-gate amplifier 310. The first amplifier 330 comprises a first transistor 332, a second transistor 334, and first and second resistors 336 and 338 coupled in series between the source of the first transistor 332 and the drain of the second transistor 334. Each of the first and second resistors 332 and 334 may have a resistance (denoted "R0") of 400Ω or another resistance, and each of the first and second transistors 332 and 334 may comprise an NMOS transistor. The resistors may be implemented using polysilicon resistors or metal resistors.

The first transistor 332 is coupled between the first input (inp) and first output (outp) of the amplifier 310 in a common-gate configuration, in which the source of the first transistor 332 is coupled to the first input (inp) via the first resistor 336, the drain of the first transistor 332 is coupled to the first output (outp), and the gate of the first transistor 332 is biased by a first bias voltage vbn1. As discussed further below, the first bias voltage vbn1 may be adjusted so that the DC voltage at the first input (inp) tracks the common-mode voltage of the input differential signal. The DC voltage may also be referred to as the bias voltage.

The drain of the second transistor 334 is coupled to the first input (inp) of the amplifier 310 via the second resistor 338, and the source of the second transistor 334 is coupled to ground. The gate of the second transistor 334 is biased by a second bias voltage vbn2 to provide a desired DC bias current for the first amplifier 330. The first and second bias voltages vbn1 and vbn2 are provided by a common-mode feedback circuit 350, as discussed further below.

As shown in FIG. 3A, the differential common-gate amplifier 310 comprises a first load resistor 360 coupled between the supply voltage Vdd (e.g., 0.9 V) and the drain of the first transistor 332. The first output (outp) of the differential common-gate amplifier 310 is taken at the node between the first load resistor 360 and the drain of the first transistor 332.

The differential common-gate amplifier 310 also comprises a second amplifier 340 coupled between the second input (inn) and second output (outn) of the differential common-gate amplifier 310. The second amplifier 340 comprises a third transistor 342, a fourth transistor 344, and third and fourth resistors 346 and 348 coupled in series between the source of the third transistor 342 and the drain of the fourth transistor 344. Each of the third and fourth resistors 342 and 344 may have a resistance (denoted "R0") of 400Ω or another resistance, and each of the third and fourth transistors 342 and 344 may comprise an NMOS transistor. In one aspect, the first and second amplifiers 330 and 340 may have substantially identical structures.

The third transistor 342 is coupled between the second input (inn) and second output (outn) of the amplifier 310 in a common-gate configuration, in which the source of the third transistor 342 is coupled to the second input (inn) via the third resistor 346, the drain of the third transistor 342 is coupled to the second output (outn), and the gate of the third transistor 342 is biased by the first bias voltage vbn1. As discussed further below, the first bias voltage vbn1 may be adjusted so that the DC voltage at the second input (inn) tracks the common-mode voltage of the input differential signal.

The drain of the fourth transistor 344 is coupled to the second input (inn) of the amplifier 310 via the fourth resistor 348, and the source of the fourth transistor 344 is coupled to ground. The gate of the fourth transistor 344 is biased by the second bias voltage vbn2 to provide a desired DC bias current for the second amplifier 340.

As shown in FIG. 3A, the differential common-gate amplifier 310 comprises a second load resistor 365 coupled between the supply voltage Vdd and the drain of the third transistor 342. The second output (outn) of the differential common-gate amplifier 310 is taken at the node between the second load resistor 365 and the drain of the third transistor 342. In one aspect, each of the first and second load resistors 360 and 365 may have approximately the same resistance (denoted "$R_L$").

In operation, the differential common-gate amplifier 310 amplifies the differential signal at the differential input (inp,inn) into an amplified differential signal at the differential output (outp,outn) using the first and second amplifiers 330 and 340. In certain aspects, the differential common-gate amplifier 310 may provide a low-frequency gain of between 6 and 8 dB or another gain, as discussed further below.

The differential common-gate amplifier 310 alleviates the need for CDM ESD protection compared to a CML differential amplifier. This is because the incoming differential signal is input to the sources/drains of the transistors 332, 334 342 and 344 in the common-gate amplifier 310 instead of the gates of the transistors. The drains/sources of the transistors typically do not require by-pass diodes for CDM ESD protection, and therefore avoid the bandwidth reduction caused by the by-pass diodes discussed above.

Another advantage of the common-gate amplifier 310 is that the input differential signal is level-shifted up for next stage processing. For example, the common-mode voltage of the input differential signal may be level-shifted up to an output common-mode voltage given by:

$$V_{out\_cm} = Vdd - I_b \cdot R_L \qquad (1)$$

where $V_{out\_cm}$ is the output common-mode voltage, and $I_b$ is the DC bias current of each of the first and second amplifiers 330 and 340. Equation (1) assumes the first and second amplifiers 330 and 340 have approximately the same bias current and the resistance of each of the load resistors 360 and 365 is $R_L$.

The voltage level shift provided by the common-gate amplifier 310 may be useful when the input different signal has a relatively low common-mode voltage. For example, the common-mode voltage (e.g., 200 mV) of the input differential signal may be below the threshold voltages (e.g., 300 mV to 400 mV) of NMOS transistors (not shown) at the inputs of the buffer 380. In this example, the common-gate amplifier 310 may level shift the input common-mode voltage up so that the output differential signal is able to properly drive the NMOS transistors.

As discussed above, the common-mode feedback circuit 350 provides the first bias voltage vbn1 to the gates of the first and third transistors 332 and 342. In one aspect, the common-mode feedback circuit 350 senses the common-mode voltage of the input differential signal, and adjusts the first bias voltage vbn1 based on the sensed input common-mode voltage such that the DC voltages at the inputs (inp,inn) of the differential amplifier 310 are approximately equal to the input common-mode voltage. This prevents DC current leakage from the inputs (inp,inn) of the amplifier 310. DC current leakage is undesirable because it can lead to relatively large variations in the input common-mode voltage. DC current leakage is a problem for the common-gate amplifier 310 because the differential input signal is DC coupled to the inputs (inn,inp) of the common-gate amplifier 310 rather than AC coupled (which blocks DC current). The common-mode feedback circuit 350 also provides the second bias voltage vbn2 to the gates of the third and fourth transistors 334 and 344.

In the example shown in FIG. 3A, the common-mode feedback circuit 350 senses the input common-mode voltage (denoted "vcm") at the node 324 between the termination resistors 326 and 328. In this regard, the combination of the termination resistors may be considered an input common-mode voltage sensor 322, in which the sensor 322 is coupled between the inputs (inn,inp) of the differential amplifier 310, and the sensed input common-mode voltage is provided at node 324.

Figure 4:
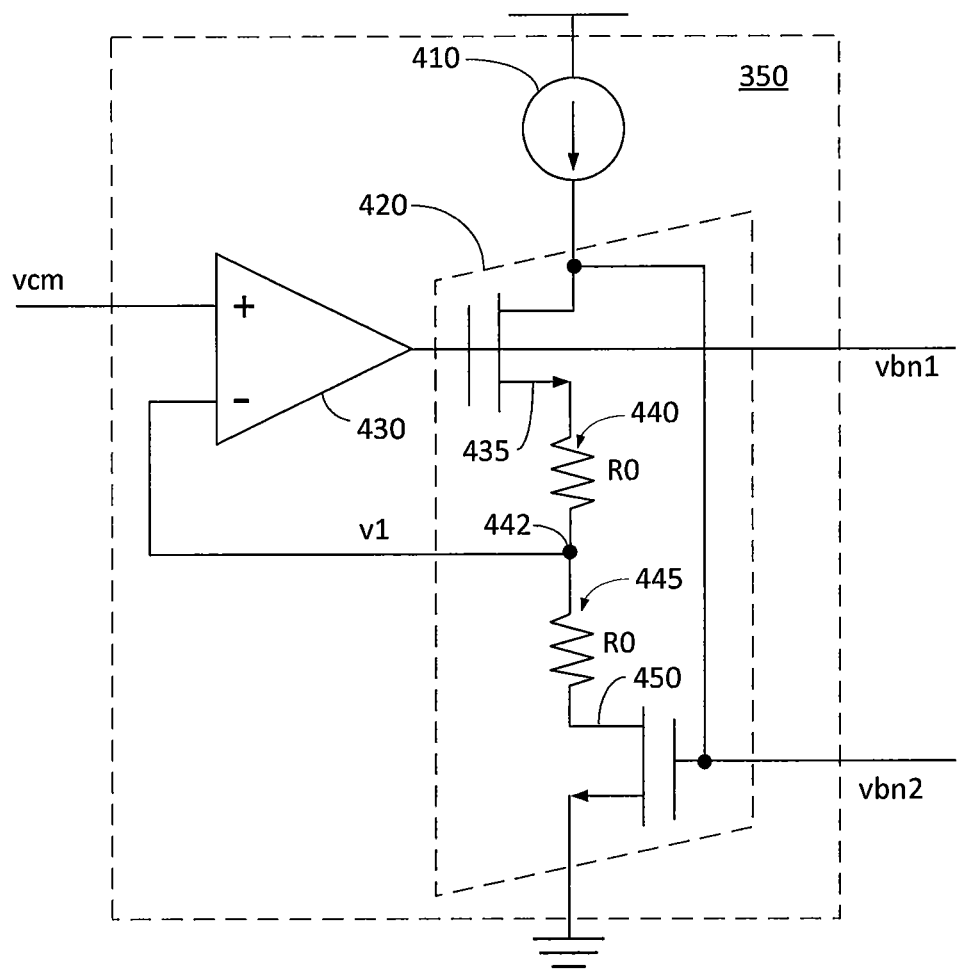
FIG. 4 shows an exemplary implementation of a common-mode feedback circuit according to an embodiment of the present disclosure.

FIG. 4 shows an exemplary implementation of the common-mode feedback circuit 350 according to an embodiment of the present disclosure. In this embodiment, the common-mode feedback circuit 350 comprises a comparator 430, a current source 410, and a replica circuit 420. The comparator 430 may comprise an operational amplifier.

The replica circuit 420 includes a fifth transistor 435, a sixth transistor 450, and fifth and sixth resistors 440 and 445 coupled in series between the source of the fifth transistor 435 and the drain of the sixth transistor 450. The replica circuit 420 may have a structure similar to the structure of each of the first and second amplifiers 330 and 340. In this regard, the fifth transistor 435 may correspond to each of the first and third transistors 332 and 342, and the sixth transistor 450 may correspond to each of the second and fourth transistors 334 and 344. Similarly, the fifth resistor 440 may correspond to each of the first and third resistors 336 and 346, and the sixth resistors 445 may correspond to each of the second and fourth resistors 338 and 348. The current source 410 is coupled to the drain of the fifth transistor 435, and is configured to provide a DC current to the replica circuit 420.

The gate of the sixth transistor 450 is coupled to the drain of the fifth transistor 435, and the source of the sixth transistor 450 is coupled to ground. The gate of the sixth transistor 450 is also coupled to the gate of the second transistor 334 in the first amplifier 330 and to the gate of the fourth transistor 344 in the second amplifier 340. As a result, the second, fourth and sixth transistors 334, 344 and 450 form a current mirror, in which the second and fourth transistors 334 and 344 mirror the current flowing though the sixth transistor 450. Since the current flowing through the sixth transistor 450 is approximately equal to the current provided by the current source 410, each of the second and fourth transistors 334 and 344 mirrors the current of the current source 410. As discussed above, the second transistor 334 provides the bias current for the first amplifier, and the fourth transistor 344 provides the bias current for the second amplifier 340. Thus, the bias current of each of the first and second amplifiers 330 and 340 is approximately equal to the current of the current source 410 (assuming the second, fourth and sixth transistors 334, 344 and 450 have approximately equal channel widths).

As shown in FIG. 4, the gate voltage of the sixth transistor 450 corresponds to the second bias voltage vbn2 input to the gates of the second and fourth transistors 334 and 344. Thus, the second bias voltage vbn2 biases each of the second and fourth transistors 334 and 344 such that the bias current of each of the transistors 334 and 344 is approximately equal to the current of the current source 410.

The comparator 430 has a first input coupled to node 324 of the common-mode voltage sensor 322 (shown in FIG. 3A), and a second input coupled to the node 442 between the fifth and sixth resistors 440 and 445 of the replica circuit 420. As a result, the first input of the comparator 430 receives the input common-mode voltage vcm from the common-mode voltage sensor 322, and the second input of the comparator 430 receives the voltage (denoted "v1") at the node 442 between the fifth and sixth resistors 440 and 445 of the replica circuit 430. The output of the comparator 430 is coupled to the gates of the first, third and fifth transistors 332, 342 and 435. Thus, the output voltage of the comparator 430 provides the first bias voltage vbn1.

Because the replica circuit 420 has a similar structure as each of the first and second amplifiers 330 and 340 and is biased by the same bias voltages (i.e., vbn1 and vbn2), the voltage (denoted "v1") at node 442 of the replica circuit 420 is approximately equal to the DC voltage at the input (inp) of the first amplifier 330 and the input (inn) of the second amplifier 340. Thus, the voltage v1 from the replica circuit 420 tracks the DC voltage at the input (inp) of the first amplifier 330 and the input (inn) of the second amplifier 340.

In operation, the comparator 430 compares the difference between v1 and vcm, and adjusts the first bias voltage vbn1 output by the comparator 430 based on the comparison in a direction that minimizes the difference between v1 and vcm. In other words, the comparator 430 adjusts the first bias voltage vbn1 until the replica voltage v1 approximately equals the input common-mode voltage vcm. As a result, the replica voltage v1 tracks the input common-mode voltage vcm. Since the DC voltage at each input (inp,inn) of the differential amplifier 310 is approximately equal to the replica voltage v1, this causes the DC voltage at each input (inp,inn) to also be approximately equal to the input common-mode voltage vcm. This prevents DC current leakage from the inputs (inp,inn) of the differential amplifier, and therefore variation in the input common-mode voltage due to DC current leakage.

Thus, the replica voltage v1 provides the comparator 430 with feedback on changes in the DC voltage at each input (inp,inn) in response to changes in the first bias voltage vbn1 output by the comparator 430. This allows the comparator 430 to adjust the first bias voltage vbn1 input to the gates of the first and third transistors 332 and 342 such that the DC voltage at each input (inp,inn) approximately equals the input common-mode voltage vcm.

Figure 5:
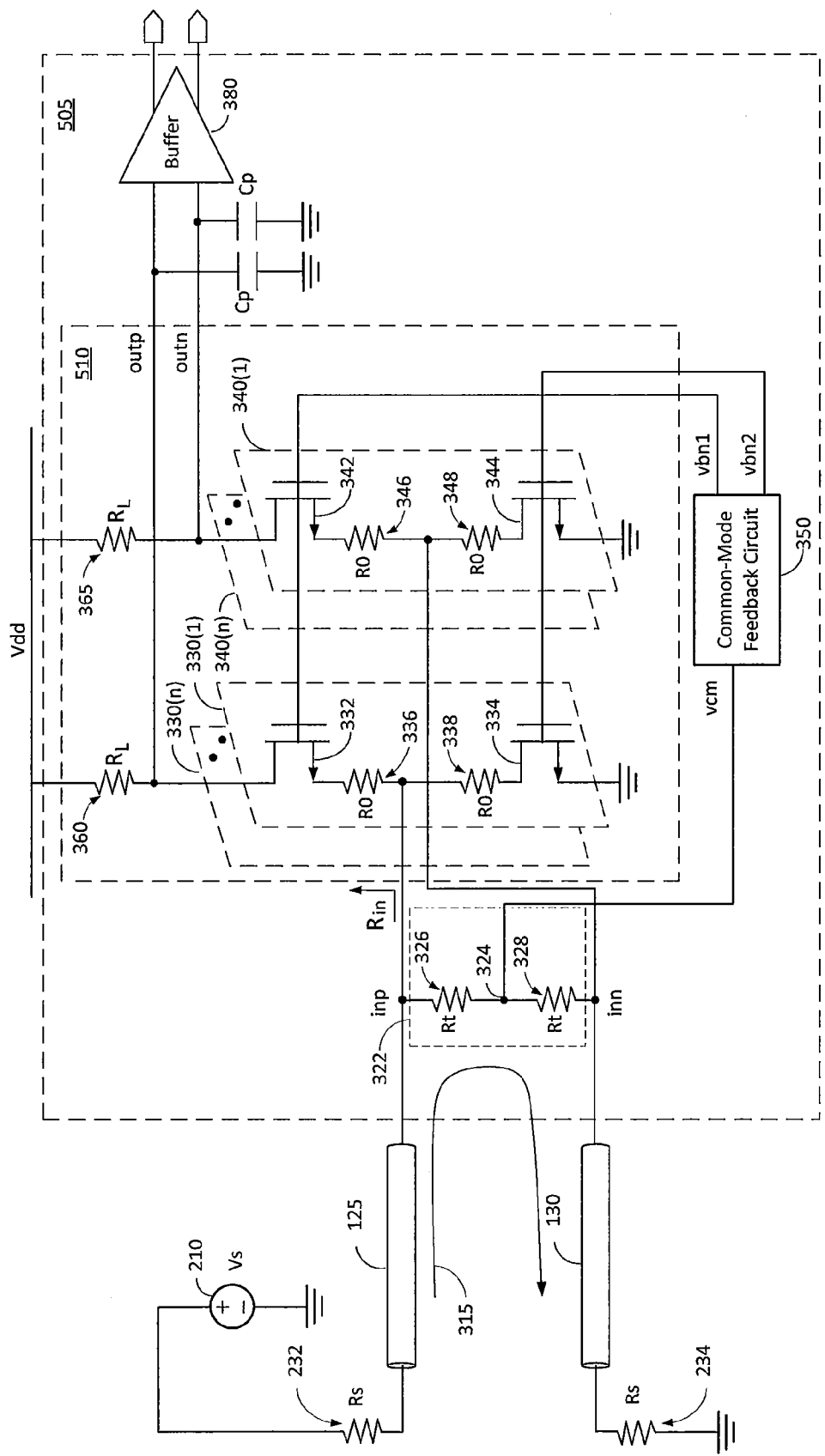
FIG. 5 shows a common-gate amplifier comprising a plurality of amplifier slices according to an embodiment of the present disclosure.

FIG. 5 shows the receiver 505 and the differential common-gate amplifier 510 according to another embodiment of the present disclosure. In this embodiment, the differential common-gate amplifier 510 comprises a first set of amplifier slices 330(1)-330(n) coupled in parallel, in which each slice may be a duplicate of the first amplifier 330 shown in FIG. 3A. For ease of illustration, FIG. 5 only shows the structure of slice 330(1) in the first set of slices 330(1)-330(n), although it is to be appreciated that each of the other slices 330(2)-330(n) in the first set of slices may have substantially the same structure. In one aspect, the number (denoted "n") of slices in the first set of slices 330(1)-330(n) equals four but may vary depending on implementation.

The first input (inp) of the differential amplifier 510 is coupled between the first and second resistors 336 and 338 of each slice 330(1)-330(n) and the first output (outp) of the differential amplifier 510 is coupled to the drain of the first transistor 332 of each slice 330(1)-330(n). The source of the second transistor 334 of each slice 330(1)-330(n) is coupled to ground.

The gate of the first transistor 332 of each slice 330(1)-330(n) is biased by the first bias voltage vbn1, and the gate of the second transistor 334 of each slice 330(1)-330(n) is biased by the second bias voltage vbn2. The first and second bias voltages vbn1 and vbn2 are provided by the common-mode feedback circuit 350, which may be implemented with the circuit shown in FIG. 4. In this example, the replica circuit 420 may have a similar structure as each of the slices, and may therefore be referred to as a replica slice. As a result, in this example, the common-mode feedback circuit 350 may set the second bias voltage vbn2 such that the bias current of each slice 330(1)-330(n) is approximately equal to the current of the current source 410. For example, if the current of the current source 410 is equal to 25 µA, then the bias current of each slice 330(1)-330(n) may be approximately equal to 25 µA. The DC current flowing through the first load resistor 360 is approximately equal to the sum of the bias currents of the slices in the first set of slices 330(1)-330(n). For example, if there are four slices (i.e., n equals four) and the bias current of each slice is 25 µA, then the DC current flowing through the first load resistor 360 is approximately equal to 100 µA.

The amplifier 510 also comprises a second set of amplifier slices 340(1)-340(n) coupled in parallel, in which each slice may be a duplicate of the second amplifier 340 shown in FIG. 3A. For ease of illustration, FIG. 5 only shows the structure of slice 340(1) in the second set of slices 340(1)-340(n), although it is to be appreciated that each of the other slices 340(2)-340(n) in the second set of slices may have substantially the same structure. In one aspect, the number of slices in the second set of slices 340(1)-340(n) equals four but may vary depending on implementation.

The second input (inn) of the differential amplifier 510 is coupled between the third and fourth resistors 346 and 348 of each slice 340(1)-340(n) and the second output (outn) of the differential amplifier 510 is coupled to the drain of the third transistor 342 of each slice 340(1)-340(n). The source of the fourth transistor 344 of each slice 340(1)-340(n) is coupled to ground.

The gate of the third transistor 342 of each slice 340(1)-340(n) is biased by the first bias voltage vbn1, and the gate of the fourth transistor 344 of each slice 340(1)-340(n) is biased by the second bias voltage vbn2. The first and second bias voltages vbn1 and vbn2 are provided by the common-mode feedback circuit 350, which may be implemented with the circuit shown in FIG. 4. In this example, the common-mode feedback circuit 350 may set the second bias voltage vbn2 such that the bias current of each slice 340(1)-340(n) is approximately equal to the current of the current source 410. The DC current flowing through the second load resistor 365 is approximately equal to the sum of the bias currents of the slices in the second set of slices.

In this embodiment, the output common-mode voltage of the amplifier 510 may be given by:

$$V_{out\_cm} = Vdd - n \cdot I_b \cdot R_L \quad (2)$$

where n is the number of slices in either the first set of slices or the second set of slices, $I_b$ is the bias current of each slice in either the first set of slices or the second set of slices, and $R_L$ is the resistance of either the first load resistor 360 or the second load resistor 365. Equation (2) assumes that the second set of slices 340(1)-340(4) has substantially the same structure as the first set of slices 330(1)-330(4).

The input resistance looking into first set of slices 330(1)-330(n) may be approximately given by:

$$R_{in} = \frac{1}{n \cdot g_m}\left(1 + \frac{R_L}{\frac{r_{ds}}{n}}\right) + \frac{R0}{n} \quad (3)$$

where $R_{in}$ is the input resistance, n is the number of slices in the first set of slices, $g_m$ is the transconductance of the first transistor 332 in each slice, $r_{ds}$ is the drain-to-source resistance of the first transistor 332 in each slice, $R_L$ is resistance of the first load resistor 360, and R0 is the resistance of the first resistor 336 in each slice. The input resistance looking to the second set of slices 340(1)-340(n) may be similarly computed. The low frequency gain of the differential amplifier 510 may be given by:

$$A_v = \frac{1}{1 + \frac{g_m \cdot R0}{1 + n \cdot g_{ds} \cdot R_L}} \cdot \frac{g_m \cdot R_L}{1 + g_{ds} \cdot R_L} \quad (4)$$

where $A_V$ is the gain, n is the number of slices in the first set of slices, $g_m$ is the transconductance of the first transistor 332 in each slice of the first set of slices, $g_{ds}$ is the drain-to-source conductance of the first transistor 332 in each slice of the first set of slices, $R_L$ is the resistance of the first load resistor 360, and R0 is the resistance of the first resistor 336 in each slice of the first set of slices. Equation (4) assumes that the second set of slices 340(1)-340(4) has substantially the same structure as the first set of slices 330(1)-330(4).

Figure 6:
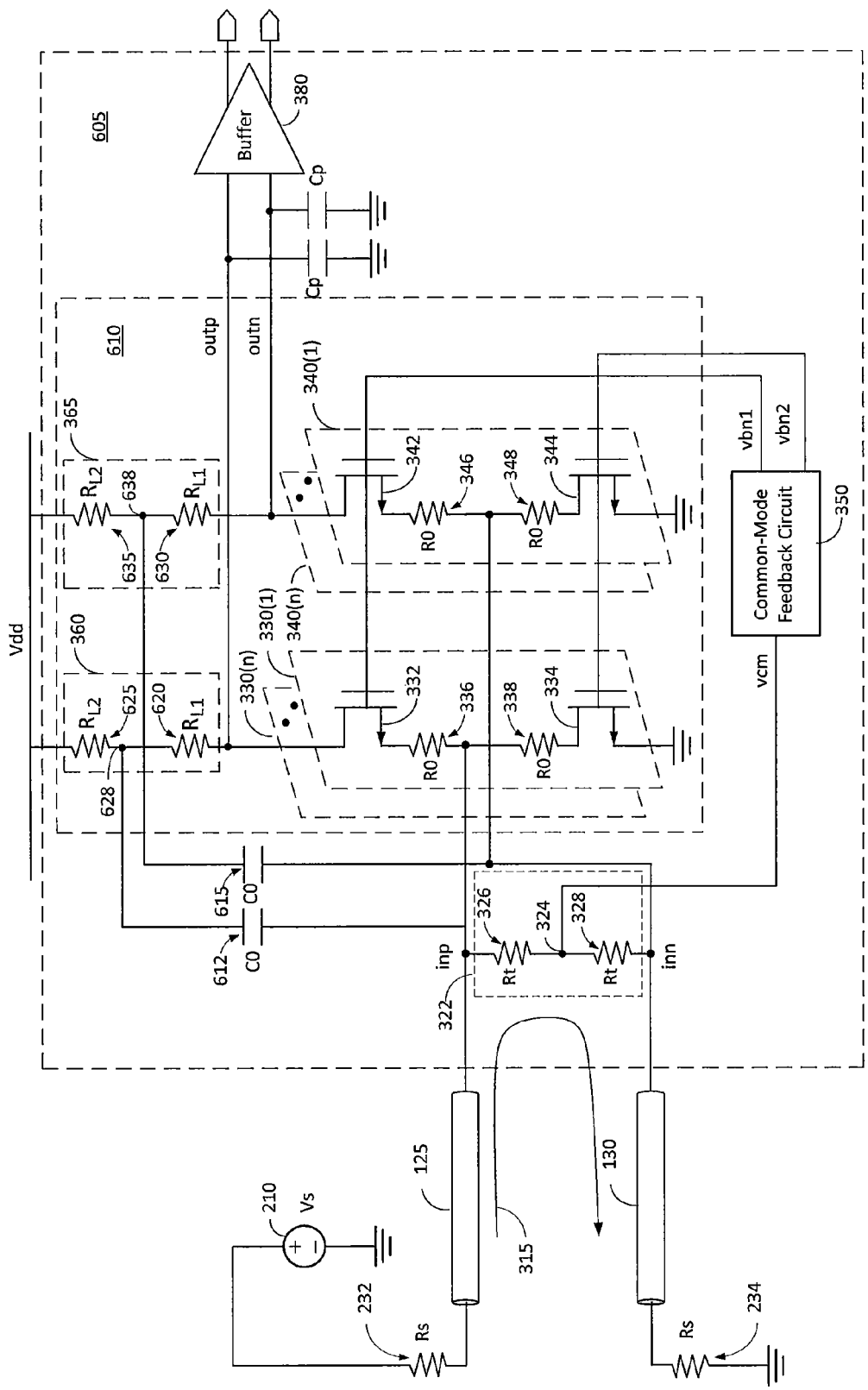
FIG. 6 shows a common-gate amplifier with shunt capacitors to extend bandwidth according to an embodiment of the present disclosure.

FIG. 6 shows the receiver 605 and the differential common-gate amplifier 610 according to another embodiment of the present disclosure, in which first and second shunt capacitors 612 and 615 are used to extend the bandwidth of the amplifier 610, as discussed further below.

In this embodiment, the first load resistor 360 comprises a seventh resistor 620 and an eighth resistor 625 coupled in series. The seventh resistor 620 has a resistance of $R_{L1}$ and the eighth resistor 625 has a resistance of $R_{L2}$, in which the sum of the resistances of the seventh and eight resistors 620 and 625 is approximately equal to the resistance $R_L$ of the first load resistor 360. The second load resistor 365 comprises a ninth resistor 630 and a tenth resistor 635 coupled in series. The ninth resistor 630 has a resistance of $R_{L1}$ and the tenth resistor 635 has a resistance of $R_{L2}$, in which the sum of the resistances of the ninth and tenth resistors 630 and 635 is approximately equal to the resistance $R_L$ of the second load resistor 365.

The first shunt capacitor 612 is coupled between the first input (inp) of the differential amplifier 610 and node 628, where node 628 is between the seventh and eighth resistors 620 and 625. More particularly, one terminal of the first shunt capacitor 612 is coupled to the first input (inp) and the other terminal of the first shunt capacitor 612 is coupled to node 628. The second shunt capacitor 615 is coupled between the second input (inn) of the differential amplifier 610 and node 638, where node 638 is between the ninth and tenth resistors 630 and 635. More particularly, one terminal of the second shunt capacitor 615 is coupled to the second input (inn) and the other terminal of the second shunt capacitor 615 is coupled to node 638. The first and second shunt capacitors 612 and 615 provide an differential AC signal path between the differential input (inp,inn) and the differential output (outp,outn) of the amplifier 610. The AC signal path adds a zero to the frequency response of the amplifier 610 that extends the bandwidth of the amplifier 610. This may be explained by way of the following example.

Figure 7:
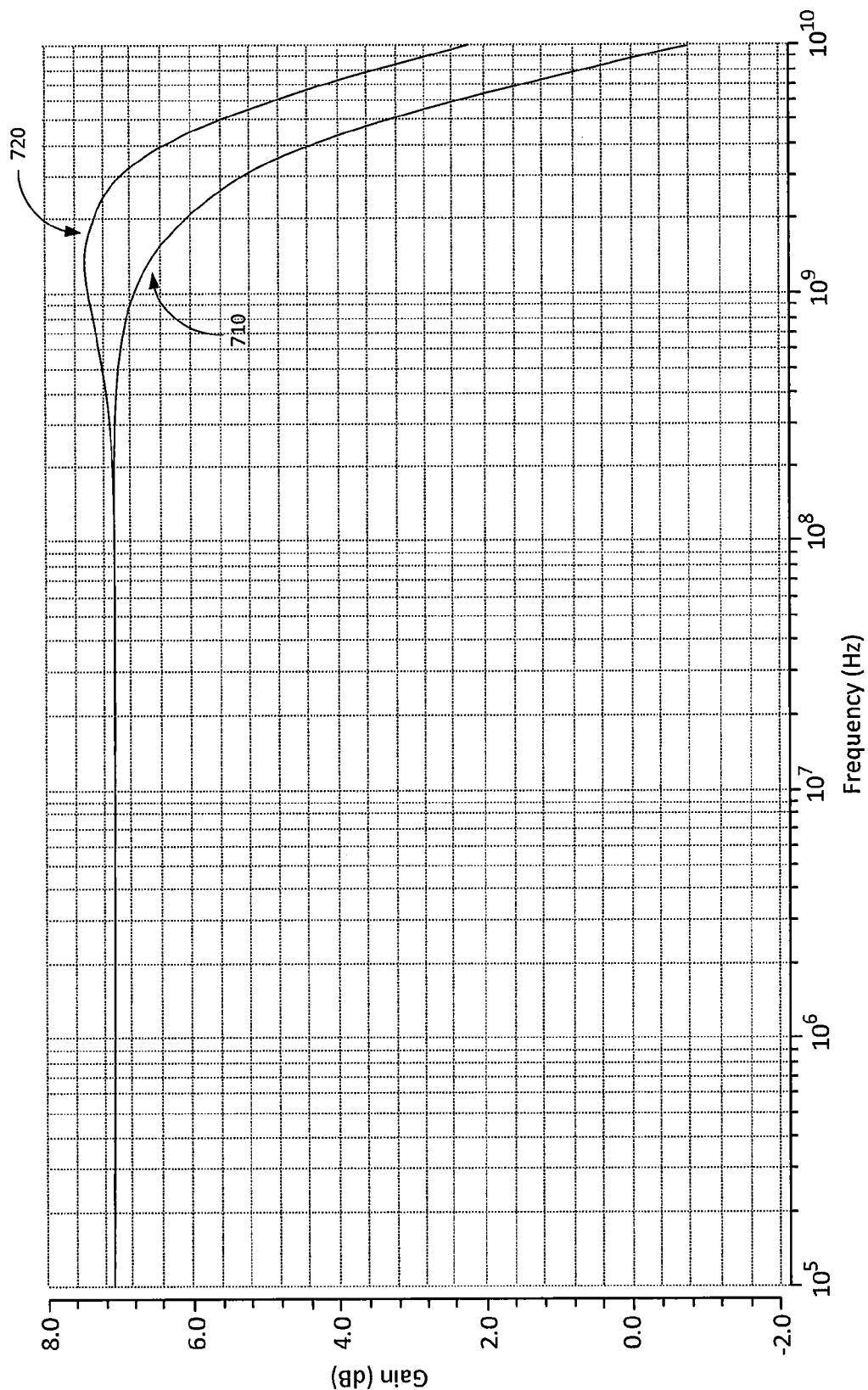
FIG. 7 is a plot showing an example of gain of a common-gate amplifier over frequency according embodiment of the present disclosure.

FIG. 7 is a plot showing an example of the gain 710 of the common-gate amplifier over frequency without the shunt capacitors 612 and 615, and an example of the gain 720 of the common-gate amplifier over frequency with the shunt capacitors 612 and 615. In this example, the capacitance CO is equal to 400 fF, the resistance $R_{L1}$ is equal to 1.2 KΩ, and the resistance $R_{L2}$ is equal to 300Ω. As shown in FIG. 7, the gain 710 without the shunt capacitors 612 and 615 rolls off at a lower frequency compared to the gain 720 with the shunt capacitors 612 and 615. This is because the shunt capacitors 610 and 612 add a zero to the frequency response of the amplifier that causes the gain to bend up, and therefore extend the bandwidth of the amplifier. In the example shown in FIG. 7, the bandwidth of the amplifier with the shunt capacitors is approximately 4.5 GHz, where the bandwidth is defined by the frequency at which the gain of the amplifier decreases by one dB from the low frequency gain of the amplifier. The low frequency gain may be estimated from equation (4) above.

The location of the zero provided by the shunt capacitors 612 and 615 may be adjusted by adjusting the resistances $R_{L1}$ and $R_{L2}$ and/or the capacitance CO. In one aspect, the zero may be located before the first pole of the amplifier 610, an example of which is shown in FIG. 7. As shown in FIG. 7, the gain 710 without the shunt capacitors 612 and 615 starts to roll off before one gigahertz due to the pole of the amplifier. In the example, the zero provided by the shunt capacitors 612 and 615 bends the gain 720 up before the pole, causing the gain to the roll off at higher frequencies and extending the bandwidth of the amplifier. The amplifier may have one or more additional poles located at higher frequencies.

Figure 8:
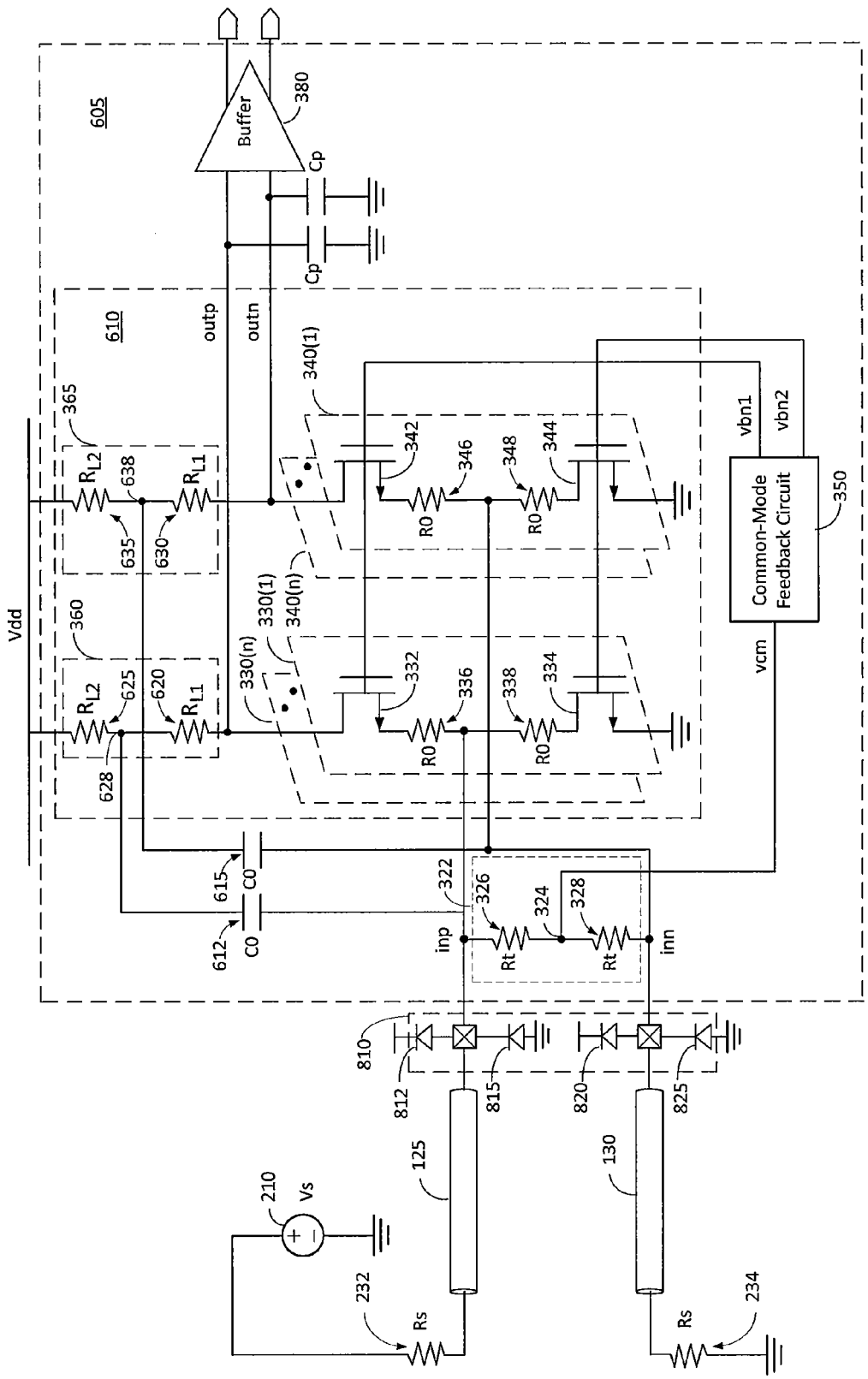
FIG. 8 shows an example of a primary electrostatic discharge (ESD) protection circuit according embodiment of the present disclosure.

FIG. 8 shows an example of a primary electrostatic discharge (ESD) protection circuit 810 that may be used to provide ESD protection (e.g., Human Body Model (HBM) ESD protection) for the receiver 605 according to an embodiment of the present disclosure. The primary ESD protection circuit 810 comprises a first ESD diode 812 coupled between the first input (inp) and a power supply rail, a second ESD diode 815 coupled between the first input (inp) and ground, a third ESD diode 820 coupled between the second input (inn) and the power supply rail, and a fourth ESD diode 825 coupled between the second input (inn) and ground. The ESD diodes 812, 820, 815, 820 and 825 protect the receiver 605 from ESD by shunting ESD currents to the power rail or ground. The ESD circuit 810 may also be used to provide ESD protection for other circuits on the same chip as the receiver 605.

In this example, the resistors 336, 338, 346 and 348 may be used to provide additional ESD protection for the transistors 332, 334, 342 and 344. This is because the resistors 336, 338, 346 and 348 delay ESD current from entering the sources/drains of the transistors 332, 334, 342 and 344. This delay provides the primary ESD circuit 810 with more time to shunt the ESD current to the power supply rail or ground. The additional ESD protection allows the use of core transistors for the transistors 332, 334, 342 and 344 instead of input/output (I/O) transistors. Core transistors are typically faster and operate at lower supply voltages than I/O transistors, resulting in higher performance and lower power consumption.

Figure 9:
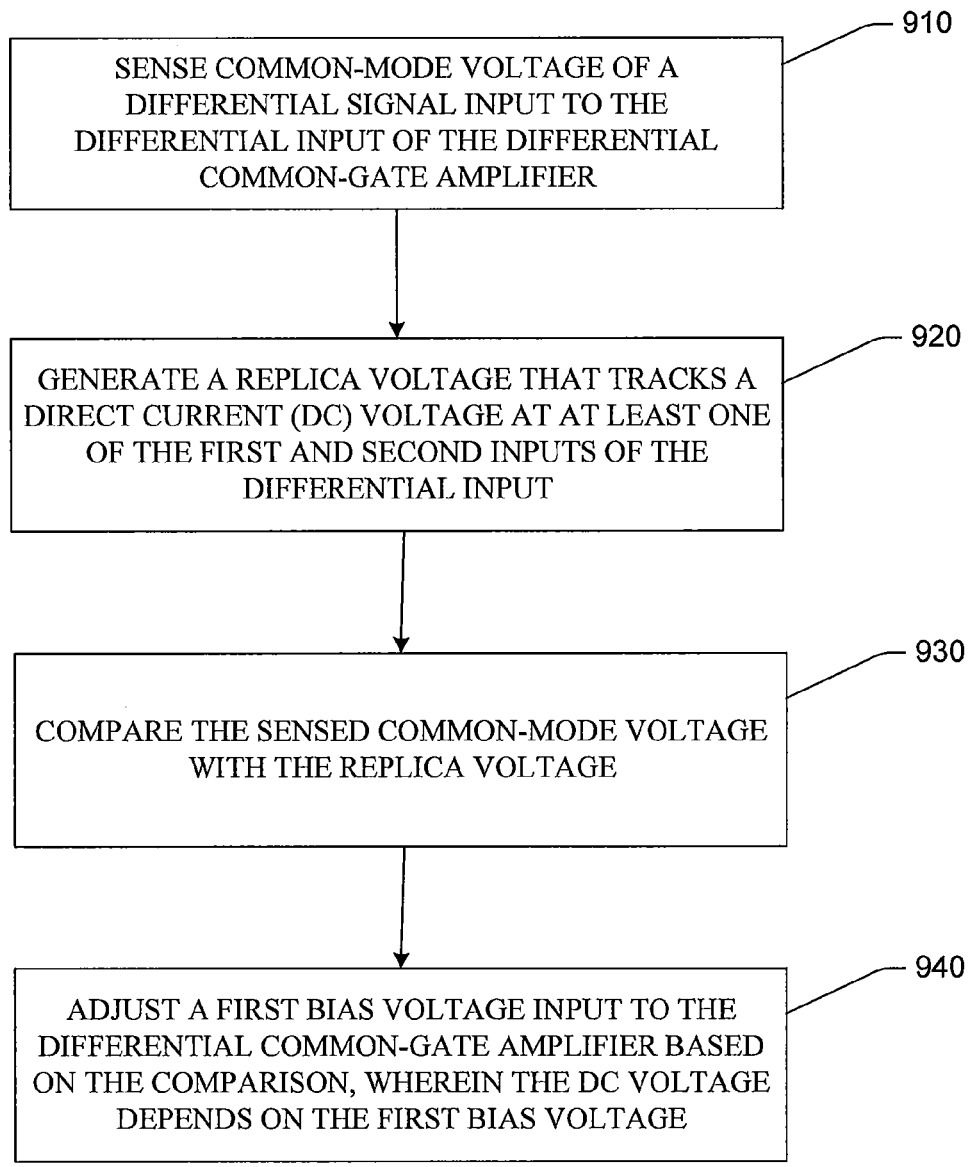
FIG. 9 is a flowchart illustrating a method for operating a common-gate amplifier according to an embodiment of the present disclosure.

FIG. 9 is a flowchart illustrating a method 900 for operating a differential common-gate amplifier according to an embodiment of the present disclosure. The differential common-gate amplifier (e.g., amplifier 310, 510 or 610) has a differential input (e.g., inp,inn) and a differential output (e.g., outp,outn), wherein the differential input comprises a first input (e.g., inp) and a second input (e.g., inn).

In step 910, a common-mode voltage of a differential signal input to the differential input of the differential common-gate amplifier is sensed. For example, the common-mode voltage may be sensed using two resistors (e.g., termination resistors 326 and 328) coupled in series between the first input and the second input. In this example, the common-mode voltage is sensed at a node (e.g., node 324) between the two resistors. The two resistors have approximately equal resistance.

In step 920, a replica voltage that tracks a direct current (DC) voltage at at least one of the first and second inputs is generated. For example, the replica voltage may be generated by a replica circuit (e.g., replica circuit 420) that has a structure similar to a portion of the differential common-gate amplifier. In one example, the replica voltage may be approximately equal to the DC voltage. The replica voltage may track the DC voltage at the first input, the DC voltage at the second input, or the DC voltage at the first and second inputs (assuming the DC voltage at the first input is approximately equal to the DC voltage at the second input).

In step 930, the sensed common-mode voltage is compared with the replica voltage. For example, the replica voltage may be compared with the common-mode voltage using a comparator (e.g., comparator 430).

In step 940, a first bias voltage input to the differential common-gate amplifier is adjusted based on the comparison, wherein the DC voltage depends on the first bias voltage. For example, the first bias voltage may be adjusted in a direction that reduces a difference between the replica voltage and the common-mode voltage. In this example, the replica voltage may be approximately equal to the DC voltage. Thus, reducing the difference between the replica voltage and the common-mode voltage reduces the difference between the DC voltage and the common-mode voltage, which, in turn, reduces DC leakage current from the common-gate amplifier.

Those skilled in the art would appreciate that the circuits described herein may be realized using a variety of transistor types, and are therefore not limited to the particular transistor types shown in the figures. For example, transistor types such as bipolar junction transistors, junction field effect transistor or any other transistor type may be used. Those skilled in the art would also appreciate that the circuits described herein may be fabricated with various IC process technologies such as CMOS, bipolar junction transistor (BJT), bipolar-CMOS (BiCMOS), silicon germanium (SiGe), gallium arsenide (GaAs), etc.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A receiver, comprising:
a differential common-gate amplifier having a differential input and a differential output, wherein the differential input comprises a first input and a second input, and the differential common-gate amplifier is configured to amplify an input differential signal at the differential input into an amplified differential signal at the differential output;
a common-mode voltage sensor configured to sense a common-mode voltage of the input differential signal;
a replica circuit configured to generate a replica voltage that tracks a direct current (DC) voltage at at least one of the first and second inputs; and
a comparator comprising an amplifier having a first input coupled to the sensed common-mode voltage, a second input coupled to the replica voltage, and an output configured to output a first bias voltage to the differential common-gate amplifier, wherein the DC voltage depends on the first bias voltage, and the amplifier is configured to compare the sensed common-mode voltage with the replica voltage, and to adjust the first bias voltage in a direction that reduces a difference between the replica voltage and the sensed common-mode voltage.

2. The receiver of claim 1, wherein the differential output comprises a first output and a second output, and the differential common-gate amplifier comprises:
a first transistor having a drain coupled to the first output, a source coupled to the first input, and a gate biased by the first bias voltage; and
a second transistor having a drain coupled to the second output, a source coupled to the second input, and a gate biased by the first bias voltage.

3. The receiver of claim 2, wherein the differential common-gate amplifier further comprises:
a first resistor coupled between the source of the first transistor and the first input; and
a second resistor coupled between the source of the second transistor and the second input.

4. The receiver of claim 2, wherein the differential common-gate amplifier further comprises:
a first load resistor coupled between a supply voltage and the drain of the first transistor; and
a second load resistor coupled between the supply voltage and the drain of the second transistor.

5. The receiver of claim 4, wherein the first load resistor comprises two resistors coupled in series between the supply voltage and the drain of the first transistor, and the receiver further comprises a shunt capacitor having one terminal coupled to the first input and a second terminal coupled to a node between the two resistors.

6. The receiver of claim 2, wherein the receiver further comprises a current source coupled to the replica circuit, the replica circuit is configured to generate a second bias voltage based on a current of the current source, and the differential common-gate amplifier further comprises:
a third transistor having a drain coupled to the first input, a source coupled to a ground, and a gate biased by the second bias voltage; and
a fourth transistor having a drain coupled to the second input, a source coupled to the ground, and a gate biased by the second bias voltage.

7. The receiver of claim 6, wherein the replica circuit comprises:
a fifth transistor having a drain coupled to the current source, a source, and a gate biased by the first bias voltage; and
a sixth transistor having a drain coupled to the source of the fifth transistor, a source coupled to the ground, and a gate coupled to the gates of the third transistor and the fourth transistor, wherein a gate voltage of the sixth transistor corresponds to the second bias voltage, and the replica voltage is provided at a node between the source of the fifth transistor and the drain of the sixth transistor.

8. The receiver of claim 1, wherein the common-mode voltage sensor comprises two resistors coupled in series between the first input and the second input, wherein the sensed common-mode voltage is provided at a node between the two resistors.

9. The receiver of claim 1, wherein the differential output comprises a first output and a second output, and the differential common-gate amplifier comprises:
a first shunt capacitor coupled between the first input and the first output; and
a second shunt capacitor coupled between the second input and the second output.

10. The receiver of claim 1, wherein the replica voltage is approximately equal to the DC voltage.

11. A method for operating a differential common-gate amplifier having a differential input and a differential output, wherein the differential input comprises a first input and a second input, the method comprising:
sensing a common-mode voltage of a differential signal input to the differential input of the differential common-gate amplifier;
generating a replica voltage that tracks a direct current (DC) voltage at at least one of the first and second inputs;
comparing the sensed common-mode voltage with the replica voltage; and
adjusting a first bias voltage input to the differential common-gate amplifier based on the comparison in a direction that reduces a difference between the replica voltage and the sensed common-mode voltage, wherein the DC voltage depends on the first bias voltage;
wherein the comparing and adjusting are performed using an amplifier having a first input coupled to the sensed common-mode voltage, a second input coupled to the replica voltage, and an output configured to output the first bias voltage.

12. The method of claim 11, further comprising generating a second bias voltage input to the differential common-gate amplifier based on a current from a current source, wherein the second bias voltage controls a bias current of the differential common-gate amplifier.

13. The method of claim 11, further comprising providing an alternating current (AC) shunt path between the differential input and the differential output to extend a bandwidth of the differential common-gate amplifier.

14. The method of claim 11, wherein the replica voltage is approximately equal to the DC voltage.

15. An apparatus for operating a differential common-gate amplifier having a differential input and a differential output, wherein the differential input comprises a first input and a second input, the apparatus comprising:
  means for sensing a common-mode voltage of a differential signal input to the differential input of the differential common-gate amplifier;
  means for generating a replica voltage that tracks a direct current (DC) voltage at at least one of the first and second inputs;
  means for comparing the sensed common-mode voltage with the replica voltage; and
  means for adjusting a first bias voltage input to the differential common-gate amplifier based on the comparison in a direction that reduces a difference between the replica voltage and the sensed common-mode voltage, wherein the DC voltage depends on the first bias voltage,
  wherein the comparing and adjusting are performed using an amplifier having a first input coupled to the sensed common-mode voltage, a second input coupled to the replica voltage, and an output configured to output the first bias voltage.

16. The apparatus of claim 15, further comprising means for generating a second bias voltage input to the differential common-gate amplifier based on a current from a current source, wherein the second bias voltage controls a bias current of the differential common-gate amplifier.

17. The apparatus of claim 15, further comprising means for providing an alternating current (AC) shunt path between the differential input and the differential output.

18. The apparatus of claim 15, wherein the replica voltage is approximately equal to the DC voltage.

* * * * *